United States Patent [19]

Schopp

[11] 4,028,689

[45] June 7, 1977

[54] CALORIMETRIC FLOW MONITOR

[75] Inventor: Hans Schopp, Altdorf, Germany

[73] Assignee: Ellenberger & Poensgen GmbH, Altdorf, Germany

[22] Filed: Sept. 18, 1975

[21] Appl. No.: 614,596

[30] Foreign Application Priority Data

Oct. 5, 1974 Germany .......................... 2447617

[52] U.S. Cl. .............................. 340/239 R; 73/204
[51] Int. Cl.$^2$ ..................... G01F 1/68; G08B 19/00
[58] Field of Search ......... 73/204; 340/233, 239 R, 340/248

[56] References Cited
UNITED STATES PATENTS

| 3,094,393 | 6/1963 | Sieger | 340/237 |
|---|---|---|---|
| 3,246,515 | 4/1966 | Martino | 73/204 |
| 3,400,582 | 9/1968 | Warner | 73/244 |
| 3,494,196 | 2/1970 | Moussette | 340/233 |
| 3,603,955 | 9/1971 | Levy | 340/239 |
| 3,617,879 | 11/1971 | Mugnier et al. | 340/248 |
| 3,641,546 | 2/1972 | Blackburn | 340/248 |
| 3,755,801 | 8/1973 | Milo | 340/248 |
| 3,781,839 | 12/1973 | Bodge | 73/204 |

FOREIGN PATENTS OR APPLICATIONS

| 1,098,077 | 1/1968 | United Kingdom | 73/204 |
|---|---|---|---|
| 1,245,402 | 9/1971 | United Kingdom | 73/204 |

Primary Examiner—Herbert Goldstein
Attorney, Agent, or Firm—Spencer & Kaye

[57] ABSTRACT

A calorimetric flow monitor comprising a measuring head adapted to be connectable to a pipe carrying a flow medium. The measuring head includes two thermistors, one of which is surrounded by a heating coil to be heated thereby. The unheated thermistor and the heatable thermistor together with its heating coil are mounted in a pair of pins protruding from the measuring head.

The thermistors are connected in an electrical bridge circuit. A first differential amplifier for determining increases and decreases in the flow of the medium relative to a preset flow is connected to the bridge circuit. Visual indicating devices are optionally provided to indicate when the flow is above and below the preset flow. A second differential amplifier for monitoring the occurrence of breakages in conductors connected to the thermistors and the heating coil, is also connected to the bridge circuit.

7 Claims, 5 Drawing Figures

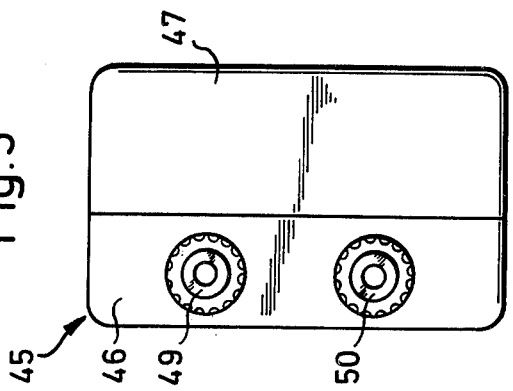
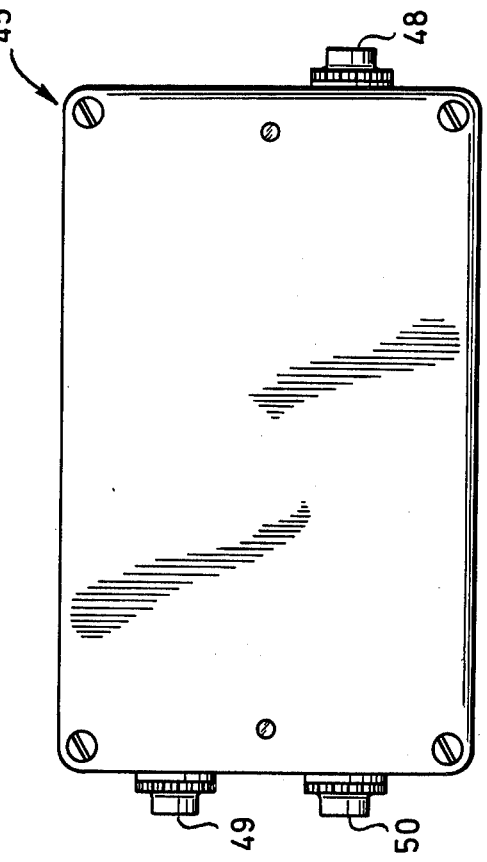

CALORIMETRIC FLOW MONITOR

The invention relates to a calorimetric flow monitor.

A calorimetric flow monitor is disclosed in U.S. Pat. No. 3,335,606 and comprises a metallic sleeve into which is inserted a further thinner metallic sleeve which serves for the passage of a cable which has six individual leads, to which the two thermistors and the heating coil for the heated thermistor are connected. In the region of the ends of these six individual leads which are are connected to two thermistors and a heating coil, the interior of the thinner metallic sleeve is tightly filled with casting resin. This casting resin tightly seals the bottom end of the bore of the thinner metallic sleeve. The two thermistors protrude from the casting resin into the flow medium. The thinner metallic sleeve has an external collar by means of which it rests against the lower end wall of the outer metallic sleeve. The upper end of the thinner metallic sleeve has an external thread onto which is screwed a cap which rests against the upper end face of the outer metallic sleeve. By using a thinner inner metallic sleeve and a cap which is screwed onto the upper end of the thinner metallic sleeve, the manufacture of this known measuring head is difficult and thereby is expensive. Furthermore, both the thermistors are directly exposed to the flow medium, so that these thermistors can be damaged by solid particles in the flow medium. In addition, the balancing of an electrical bridge circuit including the thermistors is difficult as even minute changes in the flow rate prevent accurate balancing of the bridge.

It is the object of the invention to provide a calorimetric flow monitor in which any desired flow rate can be set up, and in which increases and decreases in this flow rate and faults in the heating circuit and breaks in the sensing wire can be indicated.

According to the present invention there is provided a calorimetric flow monitor comprising a measuring head including a sleeve having means for connecting the sleeve into a pipe through which a flow medium to be monitored flows, a member formed from an insulating material secured within the sleeve, first and second elongate members mounted in the member so as to project outwardly therefrom, the first elongate member containing a first temperature sensitive device and an electrical heating element for heating the temperature sensitive device and the second elongate member containing a second temperature sensitive device, an electrical bridge circuit including the first and second temperature sensitive devices, and first and second differential amplifiers having inputs connected to the bridge circuit, the first differential amplifier serving to determine increases and decreases in the flow rate of a medium to be monitored and the second differential amplifier serving to monitor for breakages in a circuit for supplying current to the heating element and in conductors connected to the first and second temperature sensitive devices.

The first and second temperature sensitive devices may comprise thermistors which are located in respective pins, provided with a blind bore, of a chemically inert material of good heat conductivity and high compressive and flexural strength. The pins ensure that two thermistors are protected against damage. The fact that the material of the two pins has a good heat conductivity results in rapid cooling of the two thermistors by the flow medium. Since the material of the two pins is furthermore chemically inert, the two pins are not attacked chemically. Because the two pins aare fixed in the member comprising insulating material, for example screwed in, the member together with the two pins in which the two thermistors and the heating element for the heated thermistor are accommodated forms an easily fitted unit which is simple to manufacture and to fix in, for example screw into, the metallic sleeve. This means that the measuring head is simple to manufacture.

The electrical bridge is so constructed that it can be balanced for a predetermined temperature difference between the two thermistors, for example of 10° C, as a result of which a predetermined flow rate is set up at the same time. This temperature difference between the two thermistors is achievable by adjusting the current in the heating element of the first thermistor. Of course, the heating current must be kept constant. A stabilisation device, which comprises one or two potentiometers for precise setting of the current, is provided for this purpose.

The output of the first differential amplifier may, in order to determine the increases and decreases in the flow rate, be connected to an input of a comparator in the form of an operational amplifier, to the output of which is connected a flow monitoring relay, whilst a constant reference voltage is applied to its other input. To generate the constant reference voltage, a series circuit of two Zener diodes and one diode is provided.

The output of the second differential amplifier may be connected to a threshold switch which can consist, for example, of a Zener diode and a transistor and is connected to a malfunction relay.

For precise adjustment of the current in the heating coil, red and green light emitting diodes are provided in the circuit between the first differential amplifier and the comparator. If the flow becomes slower than the set threshold value, the red diode lights up. If the flow becomes faster than the set threshold value, the green diode lights up. The present invention will now be described, by way of example, with reference to the accompanying drawings, wherein.

Figure 1:
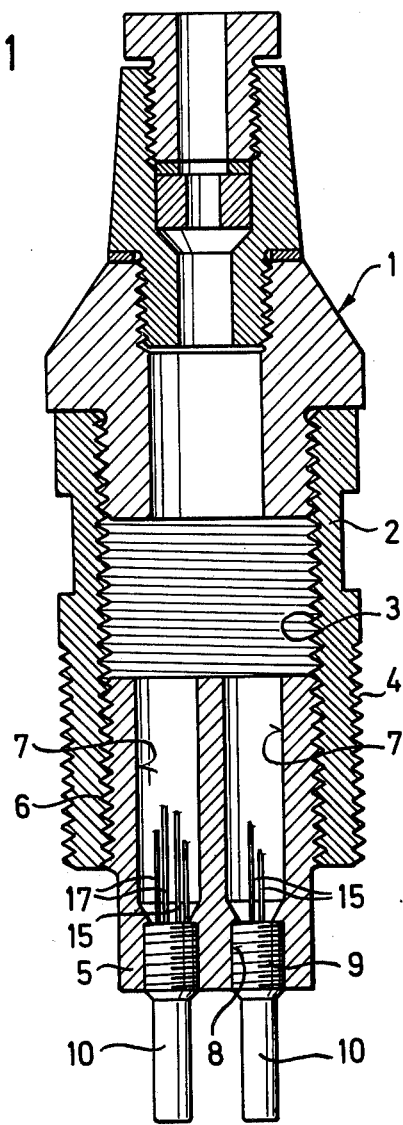
FIG. 1 shows an axial section through a measuring head of a flow monitor in accordance with the invention.
Figure 2:
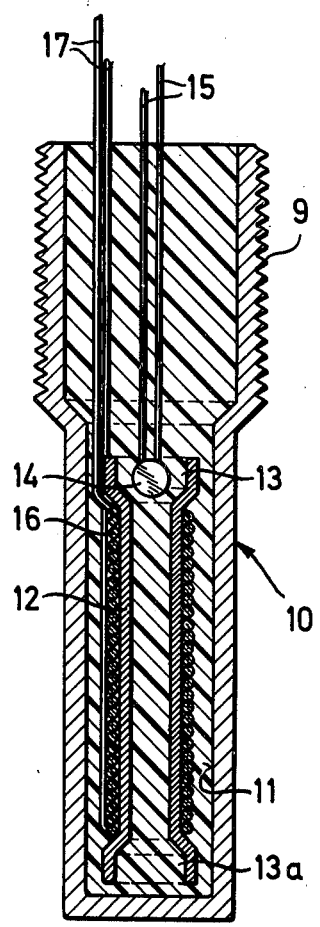
FIG. 2 shows an axial section through a pin of the measuring head shown in FIG. 1.
Figure 3:
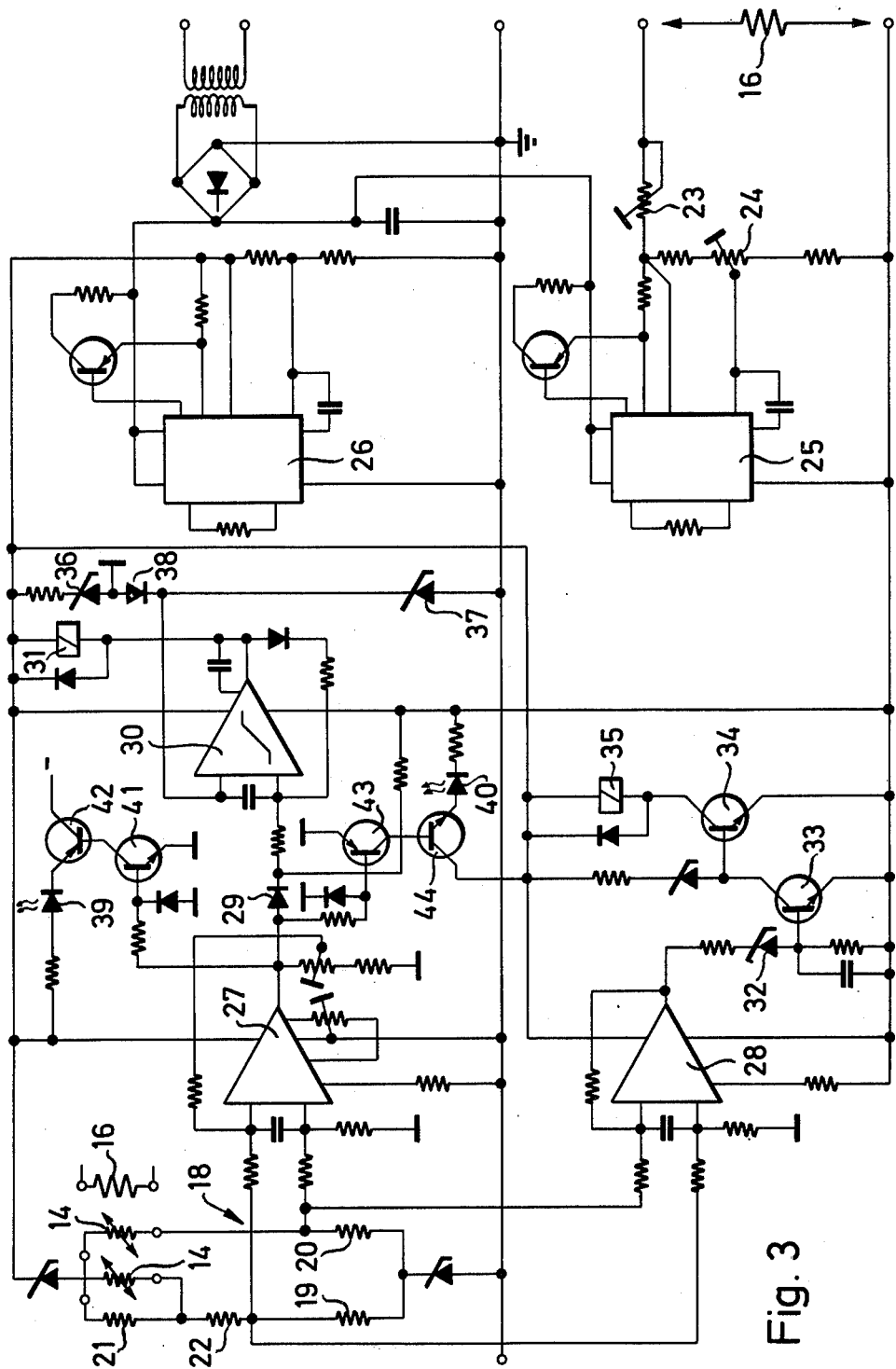
FIG. 3 is a schematic circuit diagram of the flow monitor in accordance with the invention.

FIG. 4 is a plan view of a cabinet for the electronic circuit shown in FIG. 3; and FIG. 5 is an end view of the left hand end of the cabinet shown in FIG. 4. A measuring head 1 shown in FIG. 1 has a metallic sleeve 2, which possesses an inner thread 3 and an outer thread 4 whch enables the measuring head 1 to be screwed tightly into a corresponding threaded bore of a pipe (not shown) in which a flow medium flows. The flow medium may be gaseous, liquid or granular. The measuring head 1 further possesses an insulating block 5 with an outer thread 6, by means of which the insulating block 5 is screwed tightly into the inner thread 3 of the metallic sleeve 2. The insulating block 5 is provided with two through-bores 7, which have a thread 8 at the lower end. Metallic pins 10 having an appropriate outer thread 9 are screwed tightly into the threads 8 of both bores, 7. As can be seen from FIG. 2, which represents an axial section of a pin 10, the pin 10 has a blind bore 11. The blind bore 11 carries a sleeve 12 made of copper which has flared portions 13 and 13a at its two ends. In the upper flared portion 13 of the sleeve 12 is inserted a thermistor 14 provided with two input leads 15. The thermistor 14 can of course also be inserted into the lower flared portion 13a. A heating coil 16 which has connecting leads 17 is wound over the sleeve 12. The entire inner space of the pin 10 is filled with a casting resin. The other pin 10 is also provided with a sleeve 12 made of copper, and a thermistor 14. However, this sleeve 12 is not wound with a heating coil 16, so that the thermistor 14 is not heated. The hollow pins 10 can either consist of a chemically resistant plastics which has good heat conductivity and high compressive and flexural strength, or of a metal, especially stainless steel. A casting resin of good heat conductivity is used to fill the hollow pins 10, so that the two thermistors are cooled rapidly by the flow medium.

As is shown by FIG. 3, the two thermistors 14, which are of identical construction, are in an electrical bridge circuit 18 which in addition has resistors 19 to 22. The two resistors 21 and 22, wired in series, serve as compensation resistors for stabilising the set point within a wide range of temperature of the flow medium. The electrical bridge 18 is so arranged that it is in equilibrium for a temperature difference of 10° C, which at the same time corresponds to the set point (threshold value). The temperature difference of 10° C is achieved by feeding an adjustable current to the heating coil 16 of the heated thermistor 14. The current can be set precisely with the aid of two potentiometers 23 and 24. The potentiometer 23 serves for the coarse adjustment and the potentiometer 24 for the fine adjustment. In order to keep the current in the heating coil 16 constant during operation, a stabilisation device 25 is provided. A further stabilisation device 26 serves to keep constant the operating voltage for the entire electronic circuit. The operating voltage being derived by stepping down the main A.C. voltage using a transformer and rectifying the stepped-down voltage using a full-wave rectifier. The output of the full wave rectifier is connected to a smoothing capacitor and to the stabilisation device 26 as shown in FIG. 3.

The output voltage of the electrical bridge 18 is fed to two operational amplifiers 27 and 28 which function as differential amplifiers. The operational amplifier 27 serves to monitor the flow rate and the operational amplifier 28 serves to provide indirect monitoring of breaks in the heating circuit and sensing wire.

The output signal of the operational amplifier 27 passes via a decoupling diode 29 to an operational amplifier 30, functioning as a comparator, to the output of which is connected a flow monitoring relay 31. The output signal of the operational amplifier 28 is fed to a threshold switch consisting of a Zener diode 32 and a transistor 33. This threshold switch excites a malfunction relay 35 via an amplifier which consists of a transistor 34.

Two Zener diodes 36 and 37 and a diode 38 provide a fixed reference voltage which is applied to the other input of the operational amplifier 30. This reference voltage which is substantially ground or earth potential forms a reference point for the output voltage of the operational amplifier 27, and, as already mentioned, is also applied to the operational amplifier 30.

In the circuit between the two operational amplifiers 27 and 30 there is a red light emitting diode 39 and a green light emitting diode 40 which serve to fix the set point and indicate the state of flow. When the set point is reached, both light emitting diodes 39 and 40 are dark. If the flow is slower than the set threshold value the output signal of the opertional amplifier 27 becomes positive relative to the reference point. This renders complementary transistors 41 and 42 conductive, so that the red light emitting diode 39 lights up. If the flow becomes faster than the set threshold value, a negative signal causes the green light diode 40 to light up, via complementary transistors 43 and 44.

The electronic circuit of FIG. 3 is accommodated in a cabinet 45 shown in FIGS. 4 and 5, made of an insulating material and consisting of a lower portion 46 and an upper portion 47. In the lower portion 46, three cable inlets 48 to 50 are provided, of which the cable inlet 48 serves as the inlet for the measuring head leads, the cable inlet 49 serves as an inlet for the mains lead and the cable inlet 50 serves as an inlet for the output leads.

I claim:
1. A calorimetric flow monitor for monitoring the flow of a medium through a pipe, comprising, in combination:
 a measuring head including
  a metallic sleeve having an external thread via which said head can be tightly screwed into a threaded bore of such pipe in a manner such that one end of the said sleeve is directed toward the medium and the longitudinal axis of said sleeve is perpendicular to that of the pipe,
  an insulating block tightly closing the one end of said sleeve and protruding from the one end of said sleeve, said block being provided with two through bores extending in the direction of the length of said sleeve,
  two pins each tightly fitted inot a respective one of said through bores at the end of said block which protrudes from said sleeve, said pins protruding from said block and being of a material having a high thermal conductivity and each said pin being formed to have a blind bore,
  first and second tubular, heat conductive sleeves each disposed in a respective one of said blind bores,
  first and second thermistors each disposed in a respective one of said blind bores and located within a respective heat conductive sleeve while being insulated therefrom,
  a heating coil wound on said first heat conductive sleeve for heating the respective thermistor in said first heat conductive sleeve, and
  a casting resin having good heat conductivity filling each of said blind bores for establishing a good thermal communication between each said thermistor and the flow medium when said head is disposed in a pipe through which such medium is flowing, whereby heat supplied to said first thermistor by said heating coil can be carried off by the medium and said second thermistor can be brought to the temperature of the medium;
 means defining an electrical bridge circuit including said thermistors;
 first and second differential operational amplifiers each having a pair of inputs connected at selected points of said bridge circuit;
 first signal processing means connected to the output of said first differential amplifier for deriving from the output signal therefrom an indication of in- creases or decreases in the medium flow speed from a predetermined value; and second signal processing means conducted to the output of said second differential amplifier for deriving from the output signal therefrom an indication of breakages in the connections to said heating coil and said first and second thermistors.

2. A flow monitor as claimed in claim 1, wherein said electrical bridge circuit is constructed to be balanced at a predetermined temperature difference between said first and second thermistors.

3. A flow monitor as defined in claim 2 further comprising a current supply connected to said heating coil for supplying a constant current to establish the temperature difference between said thermistors, said current supply comprising a first potentiometer connected to provide a coarse adjustment of the current to said coil, a second potentiometer connected to provide a fine adjustment of that current, and a current stabilization device connected for maintaining that current constant.

4. A flow monitor as claimed in claim 1 wherein said first signal processing means comprise a constant reference potential source, a flow monitor relay, and a comparator for determining the increases and decreases in the flow rate, said comparator being constituted by an operational amplifier having a first input coupled to said first differential amplifier, a second input coupled to said constant reference potential source, and an output coupled to said flow monitor relay, and wherein said constant reference potential source comprises a series circuit of two Zener diodes and one diode, a junction of one of said two Zener diodes and said one diode being connected to said second input of said comparator.

5. A flow monitor as defined in claim 1 wherein said second signal processing means comprise: a threshold switch connected to the output of said second differential amplifier and composed of a transistor having a control electrode and a Zener diode connecting the output of said second differential amplifier to said transistor control electrode; and a malfunction relay coupled to said transistor, and said first signal processing means comprise: a constant reference potential source; a comparator having a first input coupled to the output of said first differential amplifier, a second input coupled to said constant reference potential source; a red light emitting diode and a green light emitting diode; and means connecting said diodes in circuit between said first differential amplifier and said comparator, said light emitting diodes being de-energized when a predetermined temperature difference has been achieved by precise adjustment of the current in said heating coil, said red diode being energized in response to an output signal from said first differential amplifier corresponding to a medium flow speed below the predetermined value, and said green diode being energized in response to an output signal from said first differential amplifier corresponding to a medium flow speed above the predetermined value.

6. A flow monitor as claimed in claim 1, wherein said pins are of a metallic material.

7. A flow monitor as claimed in claim 1, wherein said pins are of a chemically inert, heat conductive material which has high compressive and flexural strength.

* * * * *